United States Patent
Xie

(10) Patent No.: US 9,627,543 B2
(45) Date of Patent: Apr. 18, 2017

(54) THIN FILM TRANSISTOR AND METHOD FOR MANUFACTURING THE SAME, ARRAY SUBSTRATE INCLUDING THE THIN FILM TRANSISTOR AND DISPLAY DEVICE INCLUDING THE ARRAY SUBSTRATE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Zhenyu Xie, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/527,893

(22) Filed: Oct. 30, 2014

(65) Prior Publication Data
US 2015/0380565 A1    Dec. 31, 2015

(30) Foreign Application Priority Data

Jun. 27, 2014    (CN) .......................... 2014 1 0302915

(51) Int. Cl.
*H01L 29/786*    (2006.01)
*H01L 29/66*    (2006.01)
(Continued)

(52) U.S. Cl.
CPC .. *H01L 29/78675* (2013.01); *H01L 21/26513* (2013.01); *H01L 29/66757* (2013.01);
(Continued)

(58) Field of Classification Search
CPC ......... H01L 29/78675; H01L 29/78609; H01L 21/02238; H01L 21/02532;
(Continued)

(56) References Cited

U.S. PATENT DOCUMENTS 5,648,277 A * 7/1997 Zhang ................. H01L 27/1214
257/E21.413
2001/0038075 A1 * 11/2001 Morishita ............... H01L 27/12
250/370.08
(Continued)

FOREIGN PATENT DOCUMENTS

| CN | 103219391 A | 7/2013 |
| JP | H08293607 A | 11/1996 |
| JP | 2006344985 A | 12/2006 |

OTHER PUBLICATIONS

Chinese First Office Action regarding Application No. 2014103029158 dated Jun. 1, 2016. Translation provided by Dragon Intellectual Property Law Firm.

*Primary Examiner* — Bilkis Jahan
(74) *Attorney, Agent, or Firm* — Harness, Dickey & Pierce, P.L.C.

(57) ABSTRACT

The present disclosure provides a TFT, a method for manufacturing the same, an array substrate and a display device, so as to effectively reduce a TFT edge leakage current $I_{OFF}$ (edge). The TFT includes an active layer and a silicon oxide layer arranged at a lateral side of the active layer.

20 Claims, 3 Drawing Sheets

(51) Int. Cl.
*H01L 21/265* (2006.01)
*H01L 21/321* (2006.01)

(52) U.S. Cl.
CPC .. *H01L 29/78609* (2013.01); *H01L 21/32105* (2013.01); *H01L 29/78621* (2013.01)

(58) Field of Classification Search
CPC ........... H01L 29/66757; H01L 27/1259; H01L 21/30604; H01L 21/02675; H01L 21/02592; H01L 21/26513; H01L 21/3081; H01L 21/02164; H01L 27/1222; H01L 21/02252
See application file for complete search history.

(56) References Cited

U.S. PATENT DOCUMENTS

2005/0062057 A1* 3/2005 Yamazaki ........... H01L 27/3244
257/98
2010/0117155 A1* 5/2010 Kitakado ............ H01L 27/1237
257/368

\* cited by examiner

THIN FILM TRANSISTOR AND METHOD FOR MANUFACTURING THE SAME, ARRAY SUBSTRATE INCLUDING THE THIN FILM TRANSISTOR AND DISPLAY DEVICE INCLUDING THE ARRAY SUBSTRATE

CROSS-REFERENCE TO RELATED APPLICATION

This application claims a priority of the Chinese patent application No. 201410302915.8 filed on Jun. 27, 2014, which is incorporated herein by reference in its entirety.

FIELD OF THE INVENTION

The present disclosure relates to the field of display technology, in particular to a thin film transistor, a method for manufacturing the same, an array substrate and a display device.

DESCRIPTION OF THE PRIOR ART

An oversize leakage current $I_{OFF}$ of a thin film transistor (TFT) is a common defect of a display device. Specifically, the leakage current is a current within the TFT when the TFT is in an off state. The oversize leakage current may result in such adverse phenomena as a deviation in a gray level displayed by a pixel electrode, and increased power consumption of the display device. Hence, how to inhibit the leakage current has become an important research field.

FIG. 1 shows an existing TFT, which includes an active layer 1', a gate insulating layer 2', a gate electrode 3', an interlayer insulating layer 4', a source electrode 5' and a drain electrode 6' arranged sequentially. For the TFT with such a structure, the leakage current mainly includes two parts, i.e., a TFT main leakage current $I_{OFF}$ (main) between the source electrode 5' and the drain electrode 6', and a TFT edge leakage current $I_{OFF}$ (edge) consisting of a leakage current between the gate electrode 3' and the source electrode 5' and a leakage current between the gate electrode 3' and the drain electrode 6'.

During the manufacture of the TFT, large parasitic capacitances may be easily generated between the gate electrode 3' and the source electrode 5' and between the gate electrode 3' and the drain electrode 6' due to factors such as an error, which thus results in an increased TFT edge leakage current $I_{OFF}$ (edge), thereby increasing leakage current of the TFT.

SUMMARY OF THE INVENTION

One technical problem to be solved by the present disclosure is to provide a TFT, a method for manufacturing the same, an array substrate and a display device, which can effectively reduce a TFT edge leakage current IOFF (edge).

In order to solve the above technical problem, one embodiment of the present disclosure provides a TFT, including an active layer and a silicon oxide layer arranged at a lateral side of the active layer.

Further, the silicon oxide layer has a thickness of 50 Å to 300 Å.

Further, the TFT further includes a source electrode and a drain electrode; the active layer includes ohm contact regions in contact with the source electrode and the drain electrode, respectively.

Further, an electron concentration in the ohm contact regions is higher than that of other regions of the active layer.

Further, the active layer further includes low-doped regions located inside the ohm contact regions, respectively.

Further, an electron concentration of the low-doped regions is higher than that of other regions on the active layer except for the ohm contact regions.

Further, the ohm contact regions are regions at two sides of the active layer; and the silicon oxide layer surrounds the ohm contact regions.

Further, the TFT further includes a gate electrode, a source electrode, a drain electrode, a gate insulating layer and an interlayer insulating layer; wherein the gate insulating layer is located on the active layer; the gate electrode is located on the gate insulating layer; the interlayer insulating layer is located on the gate electrode; and the source electrode and the drain electrode are located on the interlayer insulating layer and in electrical connection with the active layer through via-holes in the interlayer insulating layer and the gate insulating layer.

Further, the active layer includes a first surface and a second surface opposite to each other; the second surface is in contact with the gate insulating layer; the lateral side of the active layer includes a surface located between the first surface and the second surface.

In one embodiment of the present disclosure, the TFT includes the active layer, the gate electrode, the source electrode and the drain electrode, and the silicon oxide layer is arranged at the lateral side of the active layer. Since the silicon oxide layer is an insulator, thus, before forming the gate insulating layer, the entire lateral side of the active layer is covered with the insulating silicon oxide layer, so as to ensure a thickness of an insulating layer at the lateral side of the active layer and an insulating effect thereof, thereby effectively reducing the TFT edge leakage current IOFF (edge) as well as the leakage current of the TFT. As a result, a display effect of a display device may be improved and the power consumption thereof may be reduced.

One embodiment of the present disclosure further provides an array substrate including a base substrate and the above-mentioned TFT.

One embodiment of the present disclosure further provides a display device including the above-mentioned array substrate.

In order to further solve the above technical problem, one embodiment of the present disclosure further provides a method for manufacturing a TFT, including steps of: forming a pattern including an active layer on a base substrate; and forming a silicon oxide layer at a lateral side of the active layer.

Further, the forming a silicon oxide layer at a lateral side of the active layer includes: treating the lateral side of the active layer by an oxidation process to form the silicon oxide layer.

Further, the forming a pattern including an active layer on a base substrate includes: forming an amorphous silicon layer on the base substrate, and converting the amorphous silicon to polysilicon by a crystallization process; and applying photoresist onto the polysilicon, and exposing, developing and etching the photoresist to form the pattern including the active layer, the active layer being covered with the photoresist; wherein after the treating the lateral side of the active layer by an oxidation process to form the silicon oxide layer, the method further includes: removing the photoresist from the active layer.

Further, the oxidation process includes a thermal oxidation process or an oxygen plasma oxidation process.

Further, the oxidation process includes the oxygen plasma oxidation process for 10 s to 40 s.

Further, the method further includes: causing the active layer to form an ohm contact region and a low-doped region located inside the ohm contact region.

Further, the causing the active layer to form an ohm contact region and a low-doped region includes: doping the active layer with element B by ion injection; doping a region of the active layer to be in contact with the a source electrode or a drain electrode with element P by ion injection, so as to form the ohm contact region; and doping a region inside the ohm contact region with element P in an amount less than the ohm contact region by ion injection, so as to form the low-doped region.

Further, the active layer includes a first surface and a second surface arranged opposite to each other; the first surface is in contact with the base substrate; the lateral side of the active layer includes a surface located between the first surface and the second surface.

Further, the forming a silicon oxide layer at a lateral side of the active layer includes: treating the lateral side of the active layer by an oxidation process, so as to form the silicon oxide layer surrounding the active layer.

The method for manufacturing the TFT in one embodiment of the present disclosure includes forming the pattern including the active layer on the base substrate and forming the silicon oxide layer at the lateral side of the active layer. Since the silicon oxide layer is an insulator, thus, before forming the gate insulating layer, the entire lateral side of the active layer is covered with the insulating silicon oxide layer, so as to ensure a thickness of the insulating layer at the lateral side of the active layer and an insulating effect thereof, thereby effectively reducing the TFT edge leakage current IOFF (edge) as well as the leakage current of the TFT. As a result, a display effect of a display device may be improved and the power consumption thereof may be reduced.

BRIEF DESCRIPTION OF THE DRAWINGS

In order to illustrate technical solutions of the present disclosure or the prior art in a more apparent manner, the drawings used for the embodiments will be described hereinafter briefly. Obviously, the following drawings merely relate to a part of the embodiments of the present disclosure, and a person skilled in the art, may obtain other drawings based thereon without any creative effort.

DETAILED DESCRIPTION OF THE PREFERRED EMBODIMENTS

The technical solutions of the present disclosure will be described hereinafter in a clear and complete manner in conjunction with the drawings. Obviously, the following embodiments are merely some rather than all embodiments of the present disclosure. Based on these embodiments, a person skilled in the art, without any creative effort, may obtain other embodiments, which also fall within the scope of the present disclosure.

First Embodiment

One embodiment of the present disclosure provides a TFT which may effectively reduce a TFT edge leakage current $I_{OFF}$ (edge).

Figure 1:
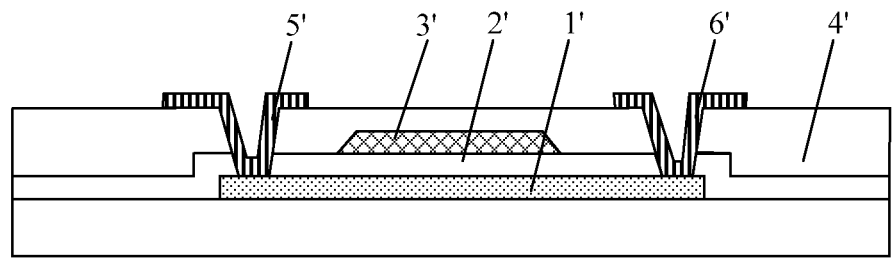
FIG. 1 is a schematic view showing an existing TFT.
Figure 2:
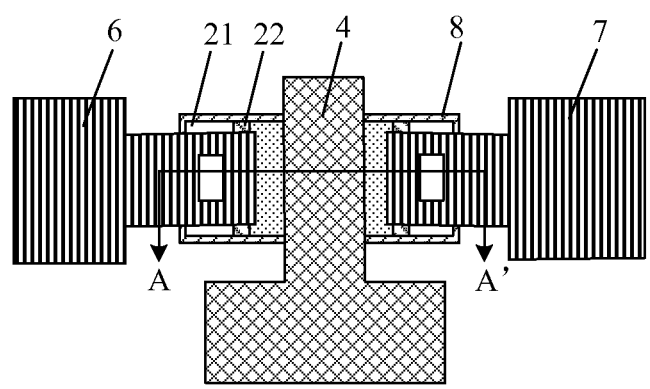
FIG. 2 is a planar view showing a TFT according to one embodiment of the present disclosure.
Figure 3:
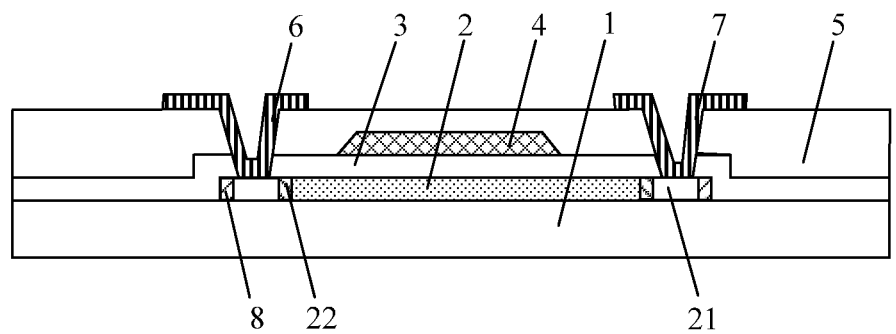
FIG. 3 is a sectional view of the TFT taken along a line A-A' in FIG. 2.

Specifically, as shown in FIGS. 2-3, the TFT includes an active layer 2, a gate electrode 4, a source electrode 6 and a drain electrode 7. A silicon oxide layer 8 is arranged at a lateral side of the active layer 2. Since the silicon oxide layer 8 is an insulator, thus, before forming a gate insulating layer, the entire lateral side of the active layer 2 is covered with the insulating silicon oxide layer 8 so as to ensure a thickness of an insulating layer at the lateral side of the active layer 2 and an insulating effect thereof, thereby effectively reducing the TFT edge leakage current $I_{OFF}$ (edge). The lateral side of the active layer 2 refers to a side of the active layer 2 other than an upper surface and a lower surface (when the TFT is located at a position shown in FIG. 3). Specifically, the active layer 2 is made of polysilicon, and the silicon oxide layer 8 has a thickness of 50 Å to 300 Å, optionally 100 Å.

Further, in order to reduce a contact resistance between the active layer 2 and the source electrode 6, and between the active layer 2 and the drain electrode 7, and to improve performance of the TFT, the active layer 2 in one embodiment of the present disclosure includes ohm contact regions 21 which contact the source electrode 6 and the drain electrode 7, respectively. Further, in order to reduce a TFT main leakage current $I_{OFF}$ (main) between the source electrode 6 and the drain electrode 7, as shown in FIGS. 2 and 3, the active layer 2 further includes low-doped regions 22 which are located inside of the ohm contact regions 21, respectively. The ohm contact regions 21 are regions located at two sides of the active layer 2. The low-doped regions 22 are located inside and adjacent to the ohm contact regions 21 of the active layer 2. In the embodiment as shown in FIG. 3, the ohm contact region 21 and the low-doped region 22 at a first side, e.g., a left side, of the active layer 2 are in contact with each other, while the ohm contact region 21 and the low-doped region 22 at a second side, e.g., a right side, of the active layer 2 are in contact with each other. In other words, in one embodiment, the ohm contact region 21 and the low-doped region 22 at the same side of the active layer 2 are in contact with each other, and the low-doped region 22 is arranged adjacent to an interior of the active layer 2. The silicon oxide layer 8 surrounds the active layer 2, i.e., the active layer 2 with its ohm contact regions 21 and the low-doped regions 22 are all located within a region surrounded by the silicon oxide layer 8.

In addition, as shown in FIG. 3, the TFT further includes a gate insulating layer 3 and an interlayer insulating layer 5. Specifically, the gate insulating layer 3 is located on the active layer 2; the gate electrode 4 is located on the gate insulating layer 3; the interlayer insulating layer 5 is located on the gate electrode 4; and the source electrode 6 and the drain electrode 7 are located on the interlayer insulating layer 5 and are in electrical connection with the active layer 2 through via-holes in the interlayer insulating layer 5 and the gate insulating layer 3. It should be appreciated that, the TFT in this embodiment is not limited to the above structure, and a person skilled in the art may set the TFT in accordance with actual situation, which will not be described herein.

Further, the TFT further includes a buffer layer (not shown) arranged between a base substrate 1 and the active layer 2 and configured to isolate the base substrate 1 from the active layer 2, so as to prevent impurities in the base substrate 1 from entering the active layer 2, thereby preventing performance of the TFT from being adversely affected. In addition, the buffer layer may be used to reduce the influence of the temperature on the base substrate 1 during the formation of the active layer 2. The butter layer is optionally made of silicon oxide or silicon nitride.

One embodiment of the present disclosure provides a TFT. The TFT includes the active layer, the gate electrode, the source electrode and the drain electrode. The silicon oxide layer is arranged at the lateral side of the active layer. Since the silicon oxide layer is an insulator, thus, the entire lateral side of the active layer is covered with the insulating silicon oxide layer so as to ensure a thickness of an insulating layer at the lateral side of the active layer and an insulating effect thereof, thereby effectively reducing the TFT edge leakage current $I_{OFF}$ (edge) as well as the leakage current of the TFT. As a result, a display effect of a display device may be improved and the power consumption thereof may be reduced.

In addition, one embodiment of the present disclosure further provides an array substrate including the base substrate and the above-mentioned TFT. The array substrate may further include such structures as pixel electrodes and a passivation layer. Based on the present disclosure, a person skilled in the art may obtain the array substrate without any creative effort, which thus is not described herein.

In addition, one embodiment of the present disclosure further provides a display device including the above-mentioned array substrate. Specifically, the display device may be any product or component having a display function, e.g., a liquid crystal panel, an electronic paper, a liquid crystal TV, a liquid crystal display, a digital photo frame, a mobile phone and a flat panel PC.

Second Embodiment

Figure 4:
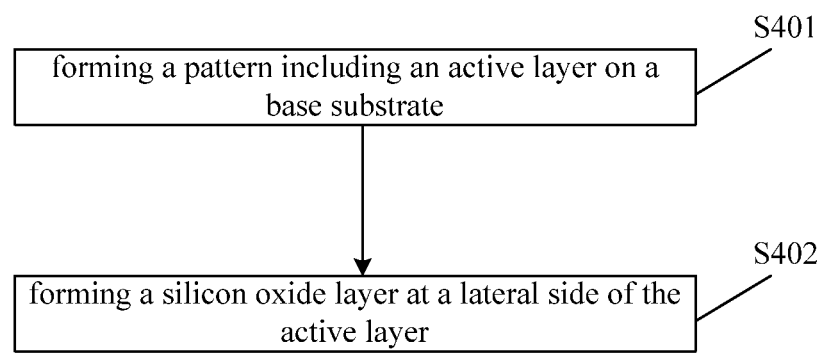
FIG. 4 is a flow chart of a method for manufacturing the TFT according to one embodiment of the present disclosure.

One embodiment of the present disclosure provides a method for manufacturing a TFT. As shown in FIG. 4, the method includes following steps.

Step S401: forming a pattern including an active layer on a base substrate 1.

Specifically, forming the pattern including the active layer 2 on the base substrate 1 includes: at first, forming an amorphous silicon layer on the base substrate 1 and converting the amorphous silicon to a polysilicon by a crystallization process. The crystallization process includes a laser annealing process and a metal-induced process, etc. The crystallization process may adopt the laser annealing process in one embodiment. Specifically, a basic principle of the laser annealing process is to irradiate a surface of the amorphous silicon layer with a high-energy excimer laser so as to melt the amorphous silicon layer, and then cool and recrystallize the layer so as to convert the amorphous silicon to the polysilicon. Next, Step S401 includes applying photoresist onto the polysilicon, and exposing, developing and etching the photoresist to form the pattern including the active layer 2. The active layer 2 is coated with the photoresist, so as to ensure that other regions of the active layer 2 will not be adversely affected during the subsequent formation of the silicon oxide layer 8 at the lateral side of the active layer 2.

Further, in order to improve performance of the TFT, before forming the active layer 2 on the base substrate 1, a buffer layer is formed on the base substrate 1.

Step S402: forming a silicon oxide layer at the lateral side of the active layer.

Specifically, forming the silicon oxide layer 8 at the lateral side of the active layer 2 includes treating the lateral side of the active layer 2 by an oxidation process, so as to form the silicon oxide layer 8. The oxidation process may be a thermal oxidation process or an oxygen plasma oxidation process. Optionally, the oxygen plasma oxidation process may be used in one embodiment for 10 s to 40 s, and optionally 20 s. The procedure of forming the silicon oxide layer 8 by the oxygen plasma oxidation process may include: subjecting oxygen to ionization in a dry etching device under the effect of an electric field so as to form the oxygen plasma, accelerating the generated oxygen plasma using the electric field, injecting the accelerated oxygen plasma into the lateral side of the active layer 2 to cause the oxygen plasma to be in contact with and bonded to a Si atom having an unsaturated bond at the lateral side of the active layer 2 so as to form a Si—O bond. In addition, the Si—O bond may also be formed by breaking an existing Si—Si bond with the oxygen plasma at a certain speed, thereby forming the silicon oxide layer 8 at the lateral side of the active layer 2.

After treating the lateral side of the active layer 2 by the oxidation process to form the silicon oxide layer, the photoresist will be removed from the active layer 2.

In addition, the pattern including the active layer 2 is usually formed by dry etching. During the dry etching, the ion bombardment at the lateral side of the active layer 2 may cause potential damage on the active layer 2, thereby adversely affecting the characteristics and stability of the TFT. For example, the potential damage may be represented as an unsmooth lateral side of the active layer 2, as well as deficiencies and unsaturated bonds present at the lateral side of the active layer 2. In this embodiment, during the procedure of forming the silicon oxide layer 8 by the oxygen plasma oxidation process, the silicon oxide layer 8 is formed, under the effect of the oxygen plasma, at the lateral side of the active layer 2 formed by dry etching and having the deficiencies and unsaturated bonds, so as to repair the potential damage within the active layer 2, thereby improving the characteristics and stability of the TFT.

The method for manufacturing the TFT may further include causing the active layer 2 to form ohm contact regions 21 and low-doped regions 22. The ohm contact regions 21 are used to reduce a contact resistance between the active layer 2 and the source electrode 6 and between the active layer 2 and the drain electrode 7, thereby improving performance of the TFT. The low-doped regions 22 are located inside the ohm contact regions 21 of the active layer 2, and are used to reduce the TFT main leakage current $I_{OFF}$ (main), thereby further reducing the leakage current of the TFT.

Figure 5:
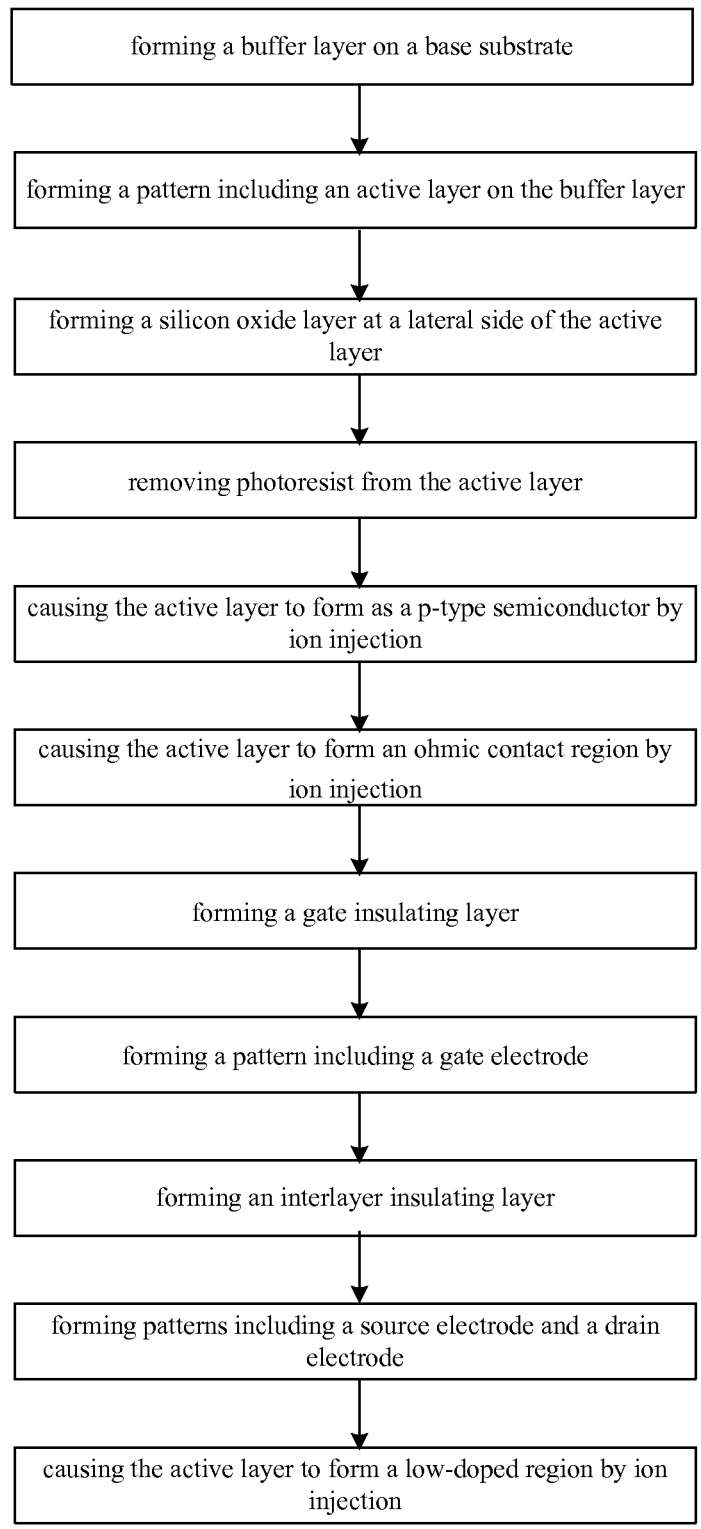
FIG. 5 is another flow chart of the method for manufacturing the TFT according to one embodiment of the present disclosure.

Further, to facilitate the understanding of the present disclosure, one embodiment of the present disclosure provides a specific method for manufacturing the TFT as shown in FIG. 5. The method includes following steps. At first, the buffer layer (not shown) is formed on the base substrate 1 so as to prevent the base substrate 1 from being damaged during the crystallization of the active layer 2, the pattern including the active layer 2 is formed on the buffer layer, the silicon oxide layer 8 is formed at the lateral side of the active layer 2, and the photoresist is removed from the active layer 2. The active layer 2 is caused to form a p-type semiconductor by ion injection. For example, the active layer 2 is doped with Element B by ion injection so as to form the active layer 2 as the p-type semiconductor. The ohm contact regions are then formed on the active layer 2 by ion injection. For example, a region of the active layer 2 to be in contact with the source electrode 6 or the drain electrode 7 is doped with element P by ion injection, so as to increase an electron concentration at this region, thereby forming the ohm contact region 21. Next, the gate insulating layer 3, a pattern including the gate electrode 4, the interlayer insulating layer 5 and patterns including the source electrode 6 and the drain electrode 7 are formed sequentially. Finally, the active layer 2 is caused to form the low-doped region 22 by ion injection. For example, a region inside the ohm contact region 21 is doped with element P in an amount less than the ohm contact region 21 by ion injection, so as to form the low-doped region 22.

The method for manufacturing the TFT in one embodiment of the present disclosure includes forming the pattern including the active layer on the base substrate and forming the silicon oxide layer at the lateral side of the active layer. Since the silicon oxide layer is an insulator, thus, before forming the gate insulating layer, the entire lateral side of the active layer is covered with the insulating silicon oxide layer, so as to ensure a thickness of the insulating layer at the lateral side of the active layer and an insulating effect thereof, thereby effectively reducing the TFT edge leakage current $I_{OFF}$ (edge) as well as the leakage current of the TFT. As a result, a display effect of a display device may be improved and the power consumption thereof may be reduced.

The foregoings are merely exemplary embodiments, but shall not be used to limit the present disclosure. A person skilled in the art may make further alternations or substitutions without departing from the principle of the present disclosure, and these alterations or substitutions shall also fall within the scope of the present disclosure. Hence, the scope of the present disclosure shall be subject to the appended claims.

What is claimed is:

1. A thin film transistor (TFT) comprising:
an active layer;
a silicon oxide insulating layer arranged only at a lateral side of the active layer,
wherein the active layer comprises ohm contact regions, the ohm contact regions are regions at two sides of the active layer, and the silicon oxide insulating layer surrounds an outer periphery of the ohm contact regions and the active layer;
a gate electrode;
a source electrode;
a drain electrode;
a gate insulating layer; and
an interlayer insulating layer,
the gate insulating layer being located on the active layer and covering both of the active layer and the silicon oxide insulating layer,
the gate electrode being located on the gate insulating layer,
the interlayer insulating layer being located on the gate electrode and covering the gate insulating layer, and
the source electrode and the drain electrode being located on the interlayer insulating layer and in electrical connection with the active layer through via-holes in the interlayer insulating layer and the gate insulating layer.

2. The TFT according to claim 1, wherein the silicon oxide insulating layer has a thickness of 50 Å to 300 Å.

3. The TFT according to claim 1, wherein the active layer comprises a first surface and a second surface opposite to each other; the second surface is in contact with the gate insulating layer; and the lateral side of the active layer includes a surface located between the first surface and the second surface.

4. The TFT according to claim 1, wherein the silicon oxide insulating layer has a shape of a frame.

5. The TFT according to claim 1, wherein the silicon oxide insulating layer has a shape of a continuous frame; and the silicon oxide insulating layer comprises a first side in direct contact with the active layer, and a second side which is separated from the active layer by one of the ohm contact regions.

6. An array substrate comprising a base substrate and a thin film transistor (TFT) according to claim 1.

7. A display device comprising an array substrate according to claim 6.

8. TFT according to claim 1, wherein an electron concentration in the ohm contact regions is higher than that of other regions of the active layer.

9. The TFT according to claim 8, wherein the active layer further comprises low-doped regions located inside the ohm contact regions, respectively.

10. The TFT according to claim 9, wherein an electron concentration of the low-doped regions is higher than that of other regions on the active layer except for the ohm contact regions.

11. The TFT according to claim 9, wherein the active layer with the ohm contact regions and the low-doped regions are all located within a region surrounded by the silicon oxide insulating layer.

12. The TFT according to claim 11, wherein the silicon oxide insulating layer has a shape of a frame.

13. A method for manufacturing the thin film transistor (TFT) according to claim 1, the method comprising:
forming a pattern including the active layer on a base substrate; and
forming the silicon oxide insulating layer only at the lateral side of the active layer.

14. The method according to claim 13, wherein the forming the silicon oxide insulating layer only at the lateral side of the active layer comprises:
treating the lateral side of the active layer by an oxidation process, so as to form the silicon oxide insulating layer surrounding the active layer.

15. The method according to claim 13, wherein the forming the silicon oxide insulating layer only at the lateral side of the active layer comprises:
treating the lateral side of the active layer by an oxidation process to form the silicon oxide insulating layer.

16. The method according to claim 15, wherein the forming the pattern including the active layer on the base substrate comprises:
forming an amorphous silicon layer on the base substrate, and converting the amorphous silicon to polysilicon by a crystallization process; and
applying photoresist onto the polysilicon, and exposing, developing and etching the photoresist to form the pattern including the active layer, the active layer being covered with the photoresist;
wherein after the treating the lateral side of the active layer by the oxidation process to form the silicon oxide insulating layer, and the method further comprises:
removing the photoresist from the active layer.

17. The method according to claim 15, wherein the oxidation process comprises a thermal oxidation process or an oxygen plasma oxidation process.

18. A thin film transistor (TFT) comprising:
a base substrate;
an active layer on the base substrate;
a first insulating layer only at a lateral side of the active layer and surrounds an outer periphery of ohm contact regions;
a second insulating layer covering both of the active layer and the first insulating layer;
a gate electrode on the second insulating layer;
a third insulating layer on the second insulating layer and covering the gate electrode;
a source electrode; and
a drain electrode;
wherein the source electrode and the drain electrode are on the third insulating layer and in electrical connection with the active layer through via-holes in the third interlayer insulating layer and the second insulating layer.

19. The TFT according to claim 18, wherein the active layer comprises a first surface and a second surface opposite to each other; the first surface is in contact with the base substrate; the second surface is in contact with the second insulating layer; the lateral side of the active layer is between the first surface and the second surface;
the first insulating layer is within a space enclosed by the base substrate, the lateral side of the active layer and the second insulating layer; and
the second insulating layer is a gate insulating layer; the third insulating layer is an interlayer insulating layer.

20. The TFT according to claim 18, wherein the first insulating layer has a shape of a continuous frame; and the first insulating layer comprises a first side in direct contact with the active layer, and a second side which is in indirect contact with the active layer.

\* \* \* \* \*